United States Patent [19]

Sato et al.

[11] Patent Number: 5,029,189
[45] Date of Patent: Jul. 2, 1991

[54] INPUT STRUCTURE FOR CHARGE COUPLED DEVICES WITH CONTROLLABLE INPUT BIAS

[75] Inventors: Maki Sato; Tadakuni Narabu; Yasuhito Maki, all of Kanagawa, Japan

[73] Assignee: Sony Corporation, Tokyo, Japan

[21] Appl. No.: 102,432

[22] Filed: Sep. 29, 1987

Related U.S. Application Data

[63] Continuation-in-part of Ser. No. 678,829, Dec. 6, 1984, abandoned.

[30] Foreign Application Priority Data

Dec. 9, 1983 [JP] Japan .............................. 58-232586
Oct. 1, 1986 [JP] Japan .............................. 61-233998
Oct. 2, 1986 [JP] Japan .............................. 61-235289

[51] Int. Cl.$^5$ ...................... H01L 29/78; G11C 19/28
[52] U.S. Cl. ...................................... 377/60; 377/58; 377/59; 377/62; 357/24; 307/351; 307/353
[58] Field of Search ...................... 377/57, 58, 59, 60, 377/61, 62, 63; 357/24, 24 M; 307/491, 494, 353, 351; 296.1–296.7; 358/213.15, 213.16, 213.18

[56] References Cited

U.S. PATENT DOCUMENTS

| 3,944,990 | 3/1976 | Chou ................................ 340/173 |
| 4,010,485 | 3/1977 | Sauer ................................ 377/58 |
| 4,118,795 | 3/1978 | Frye et al. ......................... 365/222 |
| 4,139,784 | 2/1979 | Sauer ................................ 357/24 |
| 4,262,217 | 4/1981 | Levine ............................... 377/59 |
| 4,316,100 | 2/1982 | Sakaue et al. ................... 357/24 M |
| 4,528,684 | 7/1985 | Iida et al. ........................ 377/60 |
| 4,538,287 | 8/1985 | Roberts et al. ................. 357/24 M |
| 4,625,322 | 11/1986 | Tukazaki et al. ............... 377/58 |

FOREIGN PATENT DOCUMENTS 0187054  9/1985  Japan .

OTHER PUBLICATIONS

J. Millman—"Microelectronics" McGraw-Hill, Inc.—1979—pp. 595-596.

Primary Examiner—John S. Heyman
Assistant Examiner—Tai V. Duong
Attorney, Agent, or Firm—Ronald P. Kananen

[57] ABSTRACT

A charge coupled device employs peak hold circuits for detecting electric charges transferred through reference registers for facilitating automatic iput bias control. The peak hold circuits are respectively connected to a pair of reference registers which are so designed that one of the reference registers has a given maximum rating and the other reference register is adapted to transfer electric charge having a given fraction of the maximum charge rating of the aforementioned one of registers. The peak hold circuits provide peak values of the outputs of the reference registers to a comparator which feedback controls the input bias of the one of the register. This controlled bias is also applied to an input bias for a signal register which is designed for transferring input electric charge.

4 Claims, 5 Drawing Sheets

INPUT STRUCTURE FOR CHARGE COUPLED DEVICES WITH CONTROLLABLE INPUT BIAS

CROSS REFERENCE TO THE RELATIVE APPLICATION

This application is a continuation-in-part application of the U.S. Pat. Application Ser. No. 678,829, filed on Dec. 6, 1984, now abandoned.

BACKGROUND OF THE INVENTION

The present invention relates generally to charge coupled devices (CCD's) with registers, such as CCD delay lines, for transferring electrical charges. More particularly, the invention relates to an input structure for CCD's capable of automatic adjustment of DC input bias charge.

Recently, CCD delay lines have come to be widely used in television sets and the like for delay processing. When employed in television sets, CCD delay lines are used for delay processing of analog signals, such as video signals. A DC input bias charge is commonly applied to an input section to which input signals for the CCD delay line are applied.

In the prior art, this input bias is provided by an external amplitude control of some sort. The external control is adjusted to apply a bias charge at a predetermined level to the input section of the CCD. In this conventional structure, the input bias level tends to fluctuate due to variations in the temperature-dependent characteristics of the input section. In addition, difficulty has been encountered in accurately adjusting the input bias charge by means of the external amplitude control.

For example, U.S. Pat. No. 4,139,784 discloses an CCD input circuit capable of adjusting the DC input bias to a CCD signal register serving as a CCD delay line. Feedback control of the DC input bias is performed by comparing the electric charge transferred through a reference register with a constant reference signal from a reference voltage source. However, the difficulty mentioned above may be encountered even with this structure since adjustment of the reference voltage from the reference voltage source would still be necessary. Furthermore, it may be difficult to adjust the reference voltage in precise correspondence to variations in the properties of the reference register due to the influence of temperature variations and so forth.

SUMMARY OF THE INVENTION

Therefore, it is an object of the present invention to provide an input structure for a charge coupled device capable of automatic adjustment of input bias charge.

Another object of the invention is to provide an input structure for a charge coupled device which can eliminate the influence of temperature variations on DC input bias.

A further object of the invention is to provide an improved CCD with an automatic input bias adjusting feature avoiding noise to be superimposed on a input bias controlling feedback signal.

In order to accomplish the aforementioned and other objects, in accordance with the present invention, a CCD system is provided with a reference voltage source which produces a reference signal to be compared with the electric charge transferred through a reference register. The input bias on the reference register is feedback-controlled in accordance with a difference between the charge transferred through the reference register and the reference signal value. The operating conditions of the reference voltage source are made to match those of the reference register so that the reference signal value varies in accordance with the operating conditions of the reference register.

Preferably, the reference voltage source comprises another reference register rated at a given fraction of the maximum charge rating of the reference register. The input section of the reference register is coupled to the input section of a CCD signal register to apply substantially the same input bias to the latter as is applied to the former.

The present invention also provides a charge coupled device which employs peak hold circuits for detecting electric charges transferred through reference registers for facilitating automatic input bias control. The peak hold circuits are respectively connected to a pair of reference registers which are so designed that one of the reference registers has a given maximum rating and the other reference register is adapted to transfer electric charge having a given fraction of the maximum charge rating of the aforementioned one of the registers. The peak hold circuits hold peak values of the outputs of the reference registers to a comparator which feedback controls the input bias of the one of the registers.

According to one aspect of the invention, a charge coupled device with automatic adjustment of a DC input bias comprises a signal register adapted to transfer input electric charges, a first reference register adapted to transfer electric charges from its input section to its output section, the first reference register having a first maximum charge rating, a common input gate bridging the signal register and the first reference register, a second reference register constantly supplied with a voltage substantially corresponding to a second maximum charge rating of the second reference register, the second maximum charge rating being a given fraction of the first maximum charge rating, a common output gate bridging the first and second reference registers, and a feedback circuit comparing a first charge transferred through the first reference register and a second charge transferred through the second reference register, deriving a feedback signal having a value corresponding to the difference between the first and second charges, and feedback-controlling an input bias on the first reference register to the given fraction of the first maximum charge rating, thereby feedback-controlling a DC input bias on the signal register to substantially the same charge level as that on the first reference register.

According to another aspect of the invention, a charge coupled device comprises a signal register for transferring input electric charges therethrough, the signal register having an input section, a first reference register having essentially the same structure and capacity for handling charge to transfer as to the input section of signal register, the first reference register having a first output section, a second reference register having essentially the same structure as the first reference register and provided with a capacity for handling charge to transfer rated at a given rate versus the handling charge of the first reference register, the second reference register having a second output section, a first peak hold circuit connected to the first output section of the first reference register for holding a peak value of the charge transferred through the first reference register, a second peak hold circuit connected to the second output section of the second reference register for holding a peak value of the charge transferred through the second reference register, and means for deriving a DC input bias for the input section of the signal register based on the peak values held by the first and second peak hold circuits.

The charge coupled device set forth above may be a floating gate amplifier type charge coupled device, which has output sections of the first and second reference registers comprising a floating gate for outputting outputs corresponding to the charges respectively transferred through the transfer channels of the first and second reference registers. The charge coupled device may further comprise means for forming potential wells in the transfer channels of the first and second register and downstream of the floating gate, the potential wells being deeper than that upstream of the floating gate. In the practical and preferred construction, the means for forming a potential well downstream of the floating gate comprise means for raising level of transfer pulses which are applied to transfer electrodes of the first and second reference registers and applying to the section of the corresponding first and second reference registers downstream of the floating gate.

According to a further aspect of the invention, a charge coupled device comprises a signal register for transferring input electric charge therethrough, the signal register having an input section, a first reference register having an input section of substantially the same structure as said input section of the signal register, the first reference register transferring electric charge from its input section to its output section and having a given maximum charge rating, a feedback circuit connected to the first reference register to receive an electric voltage substantially corresponding to the electric charge transferred through the first reference register, the feedback circuit including a second reference register for transferring an electric charge having a given fraction of the maximum charge rating of the first reference register and variable as a function of the environmental conditions of the first reference register, a first and second peak hold circuit for holding peak values of electric charges transferred through the first and second reference registers, and a comparator receiving the peak values held by the first and second peak hold circuits for deriving a feedback signal and applying the feedback signal to the reference register for feedback controlling a bias on the first reference register so as to maintain the electric charge at a value matching the given fraction of the maximum charge rating of the first reference register, and means for coupling the signal register to the first reference register for setting a DC input bias of the signal register to substantially the same bias as the first reference register.

According to a still further aspect of the invention, a bias voltage setting circuit for a main charge coupled device, the main charge coupled device including a first input electrode, a plurality of gate electrodes and a first output electrode, all of the first input electrode, gate electrodes and first output electrode being formed on a single semiconductor substrate, the first input electrode being applied with an A.C. signal and a first D.C. bias voltage, each of the gate electrodes being applied with a pulse voltage, an electric charge not more than the maximum transferable electric charge being transferred from the first input electrode to the first output electrode through a channel formed under the gate electrodes, the first output electrode generating a signal voltage corresponding to the transferred electric charge, wherein the bias voltage setting circuit comprises:

a first auxiliary charge coupled device including a second input electrode and a second output electrode each formed on the semiconductor substrate, the second input electrode being applied with a second D.C. bias voltage, an electric charge with a first given fraction to the maximum transferable charge of the main charge coupled device being detected by the second output electrode, the first auxiliary charge coupled device generating a first output voltage corresponding to the electric charge with the first given fraction to the maximum transferable charge of the main charge coupled device;

a first peak hold circuit connected to the first auxiliary charge coupled device and applied with the first output voltage from the first auxiliary charge coupled device, for holding a peak value of the first output voltage to generate a first D.C. voltage;

a second auxiliary charge coupled device including a third input electrode and a third output electrode, each formed on the semiconductor substrate, the third input electrode being applied with a third D.C. bias voltage, the third output electrode generating a second output voltage in accordance with the third D.C. bias voltage;

a second peak hold circuit connected to the second auxiliary charge coupled device and applied with the second output voltage from the second auxiliary charge coupled device, for holding the peak value of the second output voltage to generate a second D.C. voltage;

a comparison circuit connected to the first and second peak hold circuits and applied with the first D.C. voltage from the first peak hold circuit and the second D.C. voltage from the second peak hold circuit, for comparing the first and second D.C. voltages to generate a detection signal when the second D.C. voltage is different from the first D.C. voltage, the detection signal being supplied to the second auxiliary charge coupled device, to vary the input bias voltage so that the second D.C. voltage becomes substantially equal to the first D.C. voltage; and bias voltage supplying means connected between the third input electrode of the second auxiliary charge coupled device and the first input electrode of the main charge coupled device for supplying the third D.C. bias of the third input electrode to the main charge coupled device to use the third D.C. bias voltage as the first D.C. bias of the first input electrode.

BRIEF DESCRIPTION OF THE DRAWINGS

The present invention will be understood more fully from the detailed description given herebelow and from the accompanying drawings of the preferred embodiments of the present invention, which, however should not be taken to limit the invention to the specific embodiments but are for explanation and understanding only.

In the drawings.

DESCRIPTION OF THE PREFERRED EMBODIMENT

Figure 1:
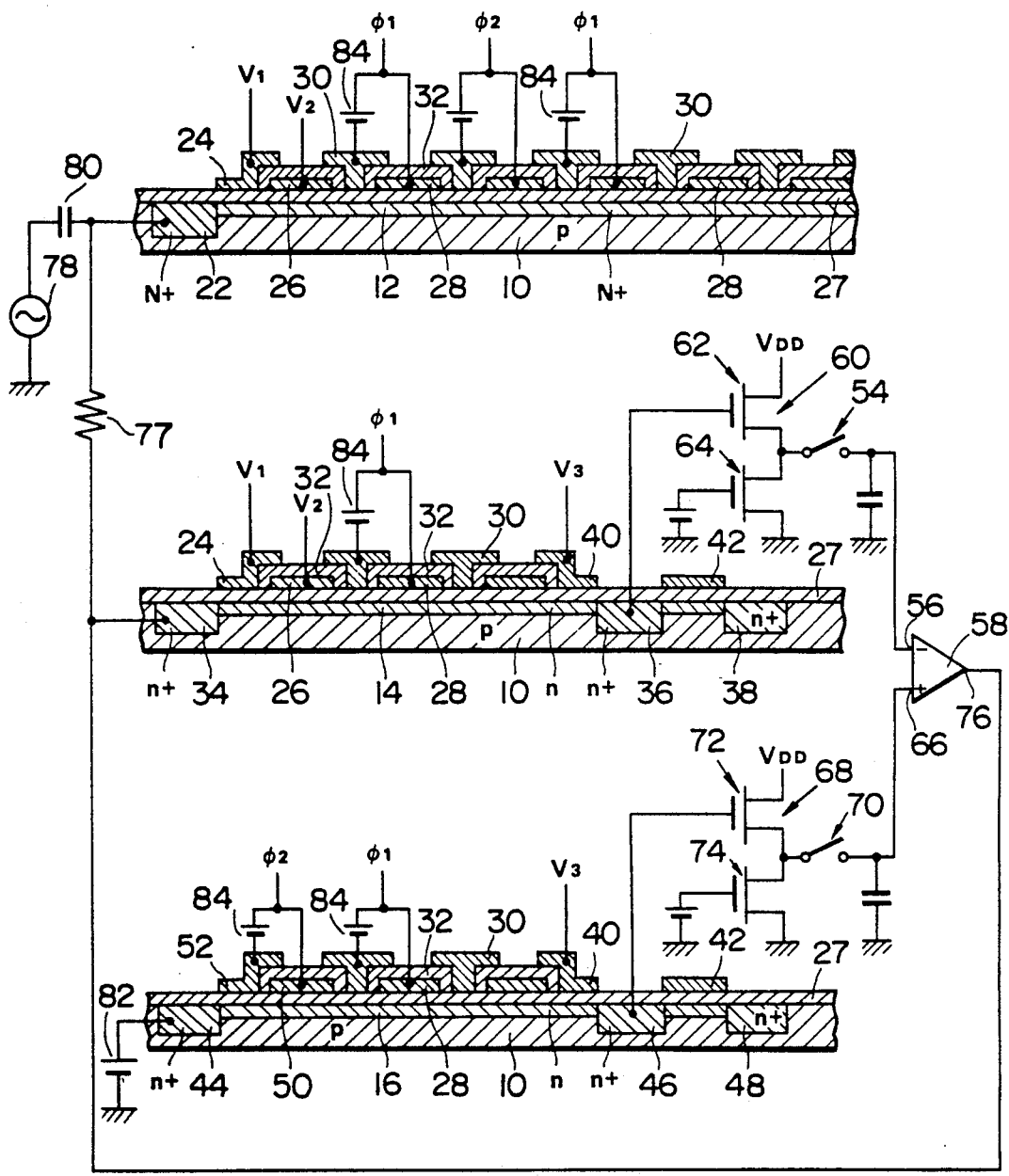
FIG. 1 is a diagrammatic cross section of the preferred embodiment of a CCD system according to the present invention, applied to a two-phase, buried-channel CCD delay line with two-level, n-channel gate electrodes.
Figure 2:
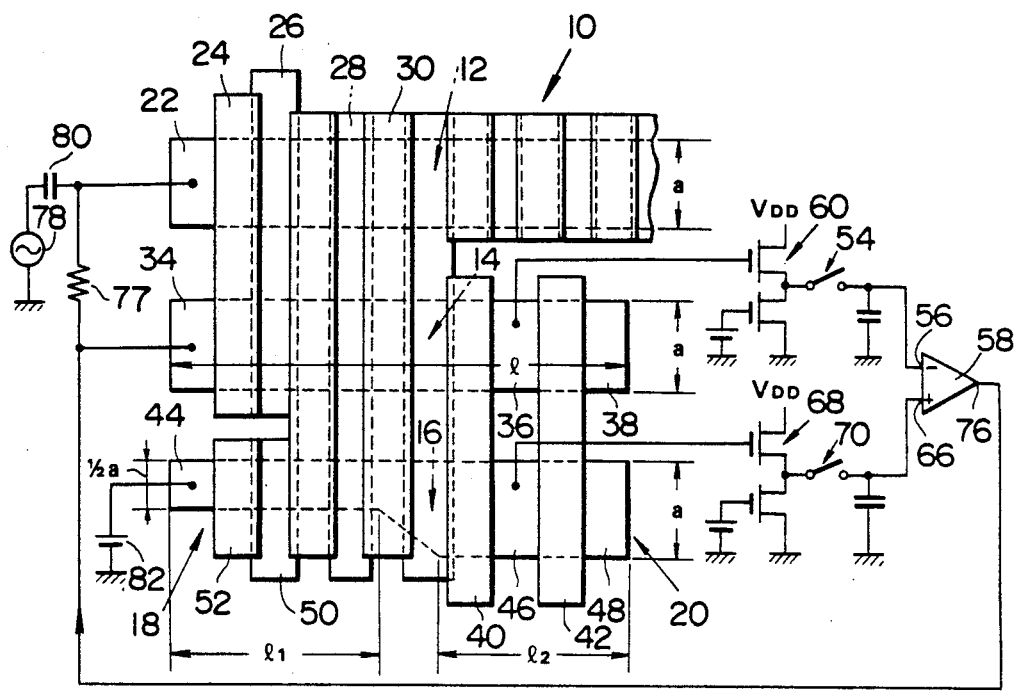
FIG. 2 is a diagrammatic plan view of the CCD system of FIG. 1.

Referring now to the drawings, FIGS. 1 and 2 illustrate the preferred embodiment of a charge coupled device system (CCD system) of the present invention in terms of a CCD delay line employing a two-phase, buried-channel device with two-level, n-channel gate electrodes. The CCD system has a P-type silicon substrate 10 common to a CCD delaying signal register (CCD delaying) 12, a first reference register 14 and a second reference register 16. The signal register 12 has a channel width a and a desired number of gates. The first reference register 14 has substantially the same channel width l as the signal register 12 and a predetermined channel length l. The second reference register 16 has substantially the same channel length l as the first reference register 14. The input end section 18 of the second reference register 16 has a channel width a/2 which is only half that of the first reference register 14 and a predetermined channel length $l_1$. The output end section 20 of the second reference register 16 has the same channel width as the other two registers 12, 14 and a predetermined channel length $l_2$. The input and output end channels of the register 16 are joined by a section of tapering width. The channels of registers 12, 14 and 16 are ribbons of N-type doped silicon sandwiched between the P-type silicon substrate 10 and an insulating layer 27 of silicon dioxide.

It should be appreciated that although a specific CCD system has been illustrated to facilitate discussion of the present invention in detail, the invention can be employed in various types of CCD systems; for example, as is well-known, CCD's can be of either a surface-channel or buried-channel type and can be driven by any of a number of control signal phasing schemes. It should also be appreciated that other electrode structures, such as single-layer or triple- layer, may be employed, and metal and polysilicon electrodes may be employed.

The signal register 12 has a source region 22 which comprises an N+ diffusion in the P-type silicon substrate 10. The signal register 12 also has first and second input polysilicon gate electrodes 24 and 26 deposited on the insulating layer 27 and mutually insulated by an interleaved insulating layer 32 of silicon dioxide. The signal register 12 also has a plurality of first-level electrodes 28 and a plurality of second-level electrodes 30 all of polysilicon and mutually insulated by SiO2 layers 32.

The first and second input gate electrodes 24 and 26 extend over the channel of the first reference register 14 so that they also serve as input gate electrodes for the latter. The first- and second-level electrodes 28 and 30 extend over both the first and second reference registers 14 and 16 to serve in pairs as shift-staging electrodes for each.

The first reference register 14 has a source region 34 which is similar to that in the signal register 12 and comprises an N+ diffusion in the P-type silicon substrate 10. The first reference register 14 also has a N+ floating diffusion region 36 and another N+ diffusion region used as a pre-charge drain region 38 following the floating diffusion region 36 but separated from the latter by a short section of channel. The first reference register 14 also has an output gate 40, 42, both of polysilicon deposited on the SiO2 insulator 27. The output gate 40 and the pre-charge gate 42 also extend over the second reference register 16 so as to serve as output gate and the pre-charge gate for the latter.

The second reference register 16 also has a source region 44 comprising an N+ diffusion region in the P-type silicon substrate 10. The source region 44 is similar geometrically to the source regions of the signal register 12 and the first reference register 14. The second reference register 16 also has a N+ floating diffusion region 46 which is similar to the floating diffusion region 36 in the first reference register 14. A pre-charge drain region 48 in the second reference register 16 is similar to the pre-charge drain region 38 in the first register 14 and is similarly separated from the floating diffusion region 46 by a short section of channel. First-level and second-level transfer electrodes 50 and 52 are also formed on the third register 16. The first-level and second-level transfer electrodes 50 and 52, made of polysilicon, are located at positions corresponding to the first and second input gate electrodes 24 and 26 of the signal register 12 and the first reference register 14.

The operating states of two switches 54 and 70 control the charge on the floating diffusion regions 36 and 46 respectively. The pre-charge drain regions 38 and 48 serve to drain the charge floating diffusion regions 36 and 46 respectively at a timing in synchronism with operation of the switches 54 and 70. For instance, electric charge at the potential in the floating diffusion regions 36 and 46 are reset to $+V_{DD}$ as constantly applied to the pre-charge drain region 38 and 48 when a resetting clock is applied to the pre-charge gate 42. The resetting clock to be applied to the pre-charge gate 42 is adapted to be produced at a timing synchronized with opening of the switches 54 and 70 with a given substantially short delay. By transferring the charge or potential to the pre-charge drain regions 38 and 48, the potential in the floating diffusion regions 36 and 46 is reset to $+V_{DD}$.

The floating diffusion region 36 is connected to the inverting input terminal 56 of a differential amplifier 58 via a source follower amplifier 60 and a switch 54. The source follower amplifier 60 comprises two source-drain-connected MOS FET's 62 and 64. Though the switch 54 is represented by a manual-throw switch symbol in the drawings, it may also be embodied as a MOS FET. Similarly, the second floating diffusion region 46 is also connected to the positive or non-inverting input terminal 66 of the differential amplifier 58 via a source follower 68 and a switch 70. As in the source follower 60, the source follower 68 comprises MOS FET 72 and 74. Again, the symbolically illustrated switch 70 will in practice be embodied as a MOS FET.

The switch ON-timing of the switches 54 and 70 is controlled by a sort of sample/hold signal to pass the voltage corresponding to the transferred charge through the first and second registers 14 and 16. The sample/hold signal may be provided with a duty cycle for controlling the switch ON-timing in synchronizm with a transfer of the charge through the registers 14 and 16. Therefore, the signalling timing would be synchronized with the signalling timing of the clocks $\phi_1$ and $\phi_2$.

The output terminal 76 of differential amplifier 58 is connected directly to the source region 34 of the first reference register 14 and to the source region 22 of the signal register 12 via a resistor 77. The source region 22 is also connected in parallel with resistor 77 to a signal source 78 via a capacitor 80. The resistor 77 is inserted to isolate the signal source 78 from the differential amplifier 58 and the first reference register 14.

It should be appreciated that the source followers 60 and 68, switches 54 and 70, the differential amplifier 58, the resistor 77, and the capacitor 80 may be formed on the same chip as the registers 10, 14 and 16.

The operation of the CCD system described above will be explained in detail. In the following description of the operation, the DC bias applied to the signal register 12 is assumed to be at the midpoint ($V_0$ in FIG. 3) of the dynamic range of the signal register 12.

As shown in FIGS. 1 and 2, a power source 82 is connected to the source region 44 of the second reference register 16. The power source 82 is rated so as to keep the source region 44 saturated with electric charge, in other words, to keep its potential well full of a charge carrier. The first-level electrodes 28 and 50 cooperate with the adjacent second-level electrodes 30 and 52 to drive electric charges from potential well to potential well along the buried channels. The direction of transfer of each electric charge packet is determined by the potential difference between adjacent potential wells which in turn is determined by the voltage levels of the two-phase clock signals ($\phi_1$, $\phi_2$) coupled to a battery 84 as well as other operating signals described later. That is, electric charge packets migrate among the asymmetrical potential wells at the various gates and electrodes until they find the local potential minima or voltage maxima.

Each electric charge thus transferred through the second reference register 16 and output through the floating diffusion region 46 is converted into a corresponding voltage by the source follower 68. The converted voltage is sample-held by the switch 70. The switch 70 thus supplies a voltage corresponding to the maximum charge rating of the second reference register 16 to the positive input terminal 66 of the differential amplifier 58. Since the source region 44 of the second reference register 16 is always saturated, the voltage applied to the positive input terminal 66 of the differential amplifier 58 constantly corresponds to the full rating of the second reference register 16.

Upon starting the CCD system, the input voltage at the negative input terminal 56 of the differential amplifier 58 is zero, since there is no electric charge transferred to the floating diffusion region 36 of the first reference register 14. At this time, since a voltage corresponding to the maximum charge rating of the second reference register 16 is applied to the positive input terminal, the output voltage of the differential amplifier 58 corresponds to the maximum charge rating of the second reference register 16. The output voltage of the differential amplifier 58 serves as a feedback voltage for the first reference register 14. The feedback voltage from the differential amplifier 5 increases the "depth" of the potential well at the source region 34 of the first reference register 14 by an amount corresponding to the feedback voltage, which, in turn, corresponds to the full rated charge of the second reference register 16.

When predetermined sampling pulse voltages $V_1$ and $V_2$ are applied to the input gate electrodes 24 and 26, an electric charge corresponding to the feedback voltage is transferred to the first-level and second-level transfer electrodes 28 and 30 from the source region 34. Subsequently, repeated application of the clock pulse voltages $\phi_1$ and $\phi_2$ to the first-level and second-level transfer electrodes 28 and 30 drives the electric charge packets to the floating diffusion region 36 via the transfer electrodes. The electric charge transferred to the floating diffusion region is converted into a voltage by the source follower 60. The switch 54 then performs sample/holding of the converted voltage. The voltage obtained by sample/holding is applied to the negative input terminal 56 of the differential amplifier 58.

Since the second reference register 16 has the first-level and second-level transfer electrodes 28 and 30 and the output gate electrode 40 in common to the first reference register 14, charge transfer is performed in the second reference register 16 at substantially the same timing as in the first reference register 14. As set forth above, the charge applied to the source region 44 of the second reference register 16 corresponds to its maximum charge rating. Therefore, when charge corresponding to the depth of the potential well in the source region 34 of the first reference register 14 is transferred to the floating diffusion 36, the charge corresponding to the maximum charge rating of the second reference register 16 is transferred to the floating diffusion region 46 of the second reference register 16. Source followers 60 and 68 operate concurrently to convert the charge in the floating diffusion regions 36 and 46 into voltages. The switches 54 and 70 also operate concurrently. As a result, voltage corresponding to the maximum charge rating of the second reference register 16 is applied to the positive input terminal 66 of the differential amplifier 58 simultaneously with the voltage from the switch 54.

The differential amplifier 58 outputs through its output terminal 76 a voltage corresponding to the difference between the input voltages. The output voltage of the differential amplifier 58 is fed back to the source region 34 of the first reference register 14. The feedback voltage from the differential amplifier 58 adjusts the depth of the potential well of the source region 34, specifically such that the difference between the input voltages of the differential amplifier 58 is reduced to zero. As a result, the charge transferred through the first reference register 14 is held as close as possible to the full charge transferred through the second reference register 16.

In other words, this feedback control causes the charge transferred through the first reference register 14 to match the charge output by the second reference register 16, i.e., the maximum charge rating of the second reference register 16.

As set forth above, the width of the input end section 18 of the second reference register 16 is half that of the first reference register 14, and thus the maximum charge rating of the first reference register 14 is twice that of the second reference register 16. Since the charge transferred through the first reference register 14 is feedback controlled to correspond to the maximum handling charge of the second reference register, the first reference register 14 handles half ($\frac{1}{2}$) of its maximum charge rating. In other words, the first reference register 14 operates under a bias of ½ of its maximum charge rating. The first reference register 14 employs the first and second input gate electrodes 24 and 26 in common with the signal register 12. Also, as set forth above, the first reference register 14 has the same channel width a as the signal register 12 and the structure of the source region 34 matches that of the source region 22 of the signal register 12. Therefore, the signal register 12 has substantially the same input structure as the first reference register 14. As a result, the bias condition of the signal register 12 will always be substantially equal to that of the first reference register 14. In other words, the bias on the signal register 12 substantially corresponds to ½ of the maximum charge rating of the first reference register 14.

Figure 3:
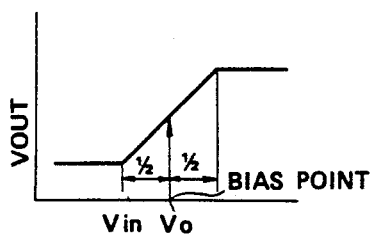
FIGS. 3, 4 and 5 are graphs showing the input/output transfer characteristics of the CCD delay line.
Figure 4:
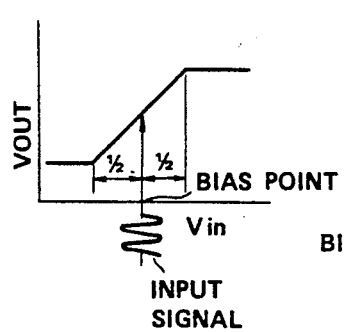

This bias condition is illustrated in FIG. 3. As shown in FIG. 4, the signal register 12 will operate at the center of its dynamic range which is especially advantageous when the input from the signal source 78 is in the form of a sine-wave.

According to the above embodiment, due to the effect of the differential amplifier and the feedback control of the depth of the potential well of then first reference register 14, the DC bias on the signal register 12 can be automatically controlled to the center half of its dynamic range. Therefore, according to the shown embodiment, it is no longer necessary to employ a conventional amplitude control for adjustment of the DC bias on the signal register. Furthermore, it is also unnecessary to manually adjust the DC bias on the signal register 14, as the DC bias can be automatically controlled. In addition, since the first reference register 14 has substantially the same input structure as the signal register 12 and has substantially the same output structure as that of the second reference register 16, the input section of the first reference register 14 will be influenced by the same temperature variation as that subjected to the input section of the signal register 12. On the other hand, the output section of the first register 14 will be subject to the influences of the same temperature variations as the output section of the second output register 16. As a result, the bias on the first reference register 14 can be maintained accurately at one-half rating. Thus, the DC input bias on the signal register 12 can be constantly maintained at one half the maximum charge rating irrespective of temperature variations.

In order to fabricate the input end section of the second reference register 16 at a channel width of precisely ½ the width a of the first reference register 14 and the signal register 12 in order to obtain a DC input bias corresponding to ½ its maximum charge rating, the photo-mask pattern used during the exposure process in the semi-conductor IC fabrication process should be designed to have an input channel of the proper width. According to the present invention, the DC bias level can be set with very high accuracy simply by proper design of the photo-mask pattern. This production process also ensures good reproducibility.

Furthermore, in accordance with the shown embodiment, since the channels of the signal register 12, the first reference register 14, and the second reference register 16 are aligned in parallel to each other, the first-level transfer electrodes 28 and the second-level transfer electrodes 30 can be conveniently formed in common to all three registers 12, 14 and 16. Additionally, this allows the first and second input electrodes 24 and 26 of the signal register 12 and the first reference register 14 to be conveniently formed in common. Similarly, the output gate electrode 40 and the pre-charge gate 42 of the first and second reference register 14 and 16 can be formed in common.

Figure 5:
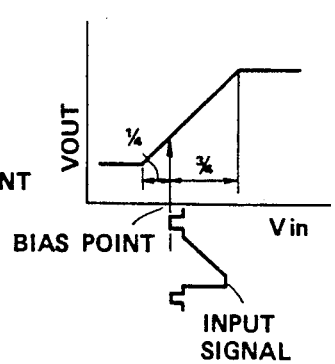
Figure 6:
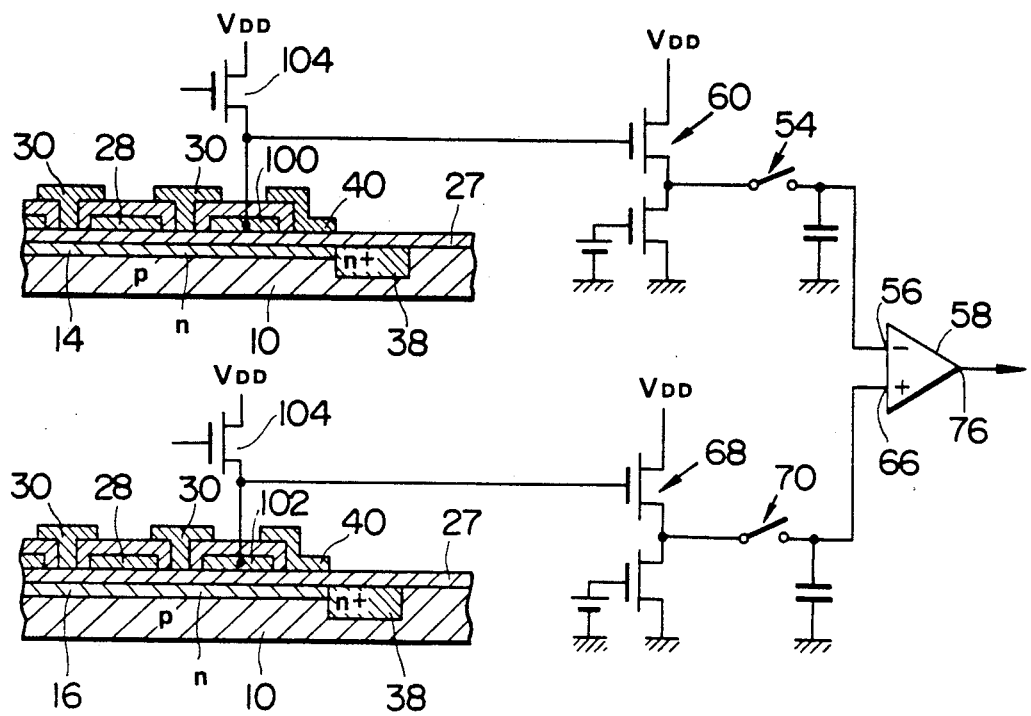
FIG. 6 is a diagrammatic partial cross-section of another embodiment of the CCD system according to the present invention.

Although the aforementioned preferred embodiment has been directed to a CCD system with a signal register DC input bias set in the center of its dynamic range, the invention is not limited to this specific level, but rather can be selected to be any arbitrary value. It is only necessary to elect the width of the second reference register in relation to the width of the first reference register to obtain the desired level of DC input bias. For instance, if a DC input bias lying at ¾ of the maximum charge rating or of the dynamic range is preferred, as shown in FIG. 5, then the width of the input end section 18 of the second reference register 16 should be 3a/4, where a is the channel width of the first reference register 14 and the signal register 12. In this case, the input bias will be clamped at the voltage level of ¾ of the dynamic range of the signal register In the aforementioned embodiment, the charges transferred through the first and second reference registers 14 and 16 are output to the source followers 60 and 68 through the floating diffusions 36 and 46 and then input to the input terminals 56 and 66 of the differential amplifier 58. However, the structure shown in FIG. 6, for example, may be used instead. In this embodiment, $N^+$ floating gates 100 and 102 made of polysilicon are formed on the P-type silicon substrate 10. The floating gates 100 and 102 are connected to the source followers 60 and 68 respectively. With this arrangement, the charge transferred through the first and second reference registers 14 and 16 can be sensed as image forces produced at the floating gates.

Reset switches 104 are connected to the floating gates 100 and 102 to control their potentials. The charges at the floating gates 100 and 102 are fed to the corresponding input terminals 56 and 66 of the differential amplifier in the form of voltages corresponding to the charges via the source followers 60 and 68. As in the embodiment of FIGS. 1 and 2, the output of the differential amplifier 58 is fed back to the first reference register 14 to control the bias thereon and accordingly the DC input bias on the signal register.

Figure 7:
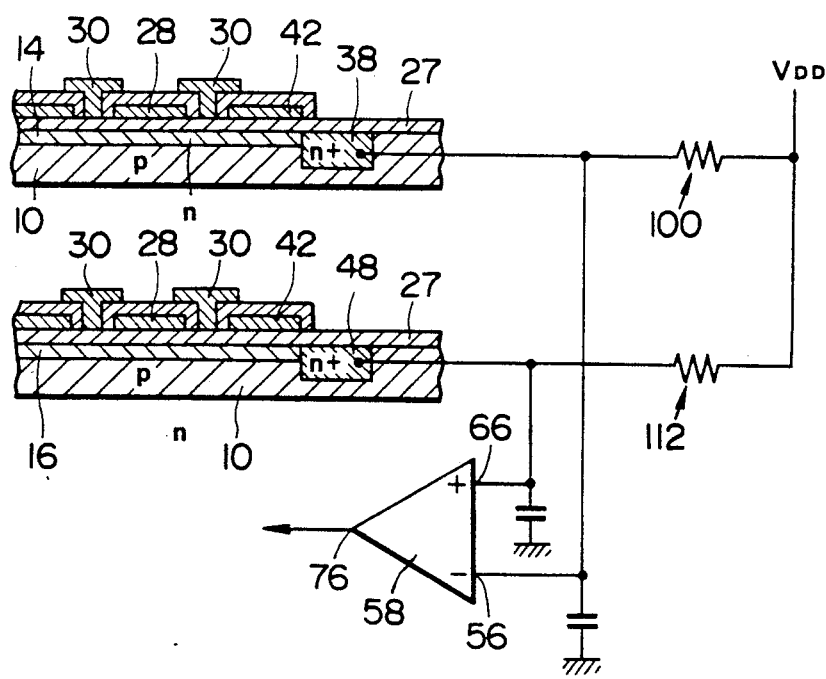
FIG. 7 is a diagrammatic partial cross-section of a further embodiment of the CCD system according to the present invention.

FIG. 7 shows a further embodiment of the CCD system according to the present invention. In this system, the pre-charge drain regions 38 and 48 are connected to power source $V_{DD}$ resistors 110 and 112. The input terminals 56 and 66 of the differential amplifier 58 are connected between the pre-charge drain gates 38 and 48 and the resistors 110 and 112 respectively. As a result, voltages respectively corresponding to the voltage drops across the resistors 110 and 112 and the pre-charge drain regions 38 and 48 are applied to the input terminals 56 and 66 of the differential amplifier. Therefore, according to this embodiment, the differential amplifier compares the voltage drops exerted by each effect of the pre-charge drain regions 38 and 48. The output of the differential amplifier 58 is used as a feedback signal to feedback control the bias on the first reference register 14 to the desired fraction of its maximum charge rating. As a result, the DC input bias on the signal register 12 can be controlled automatically.

Although the shown embodiments employ a diode cut-off system for inputting signals to the source regions 22, 34 and 44 of the signal register 12 and the first and second reference registers 14 and 16 by exerting a voltage on the source region, other input systems, such as a potential-balance system, can be employed. When some other input system is used, the connections to the differential amplifier should be adapted accordingly so that the charge transferred through the first reference register can be constantly and automatically controlled to ½ of its maximum charge rating.

Figure 8:
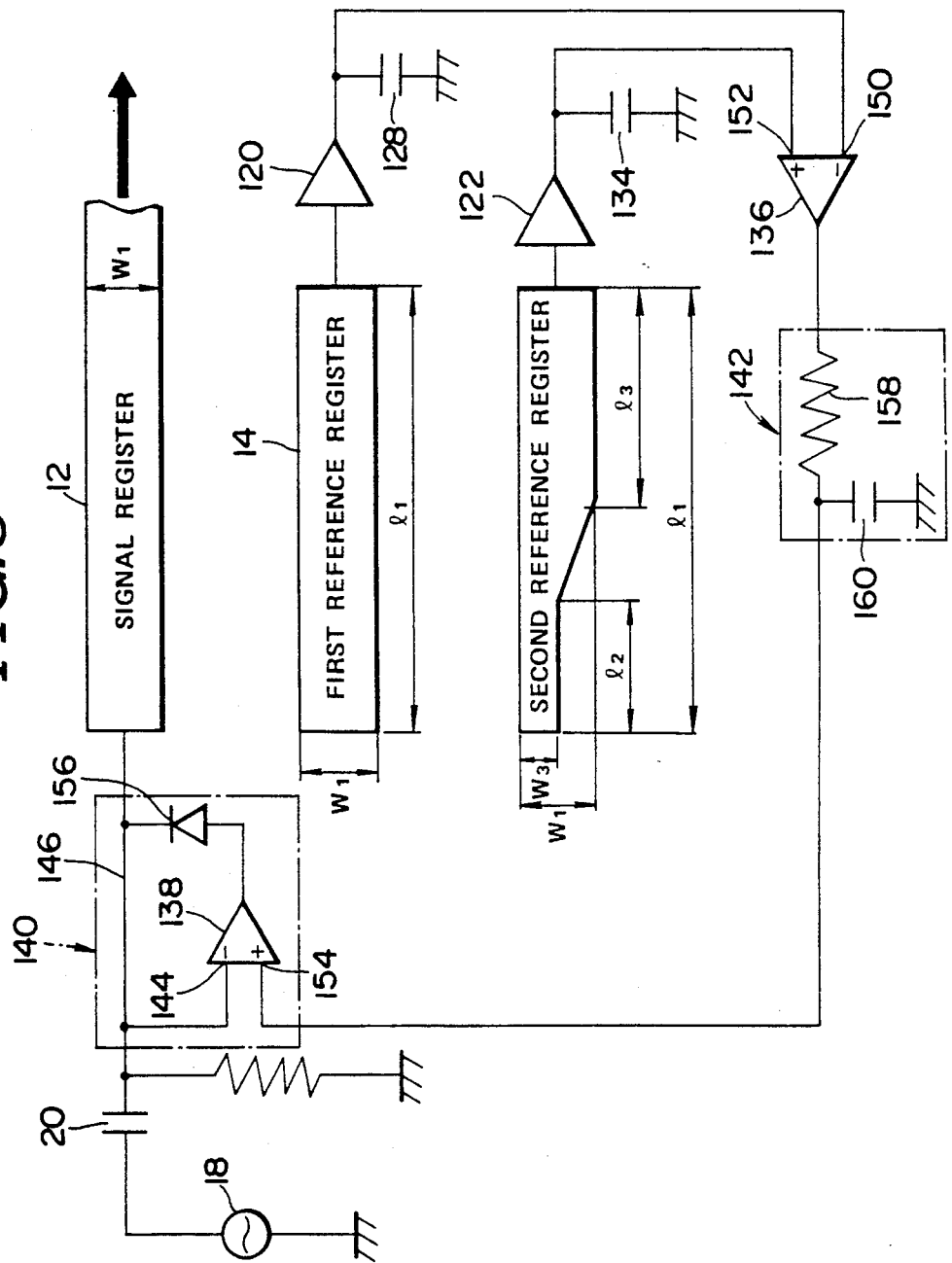
FIG. 8 is a block diagram of the preferred embodiment of a CCD system with an automatic input bias adjusting feature, according to the invention.
Figure 9:
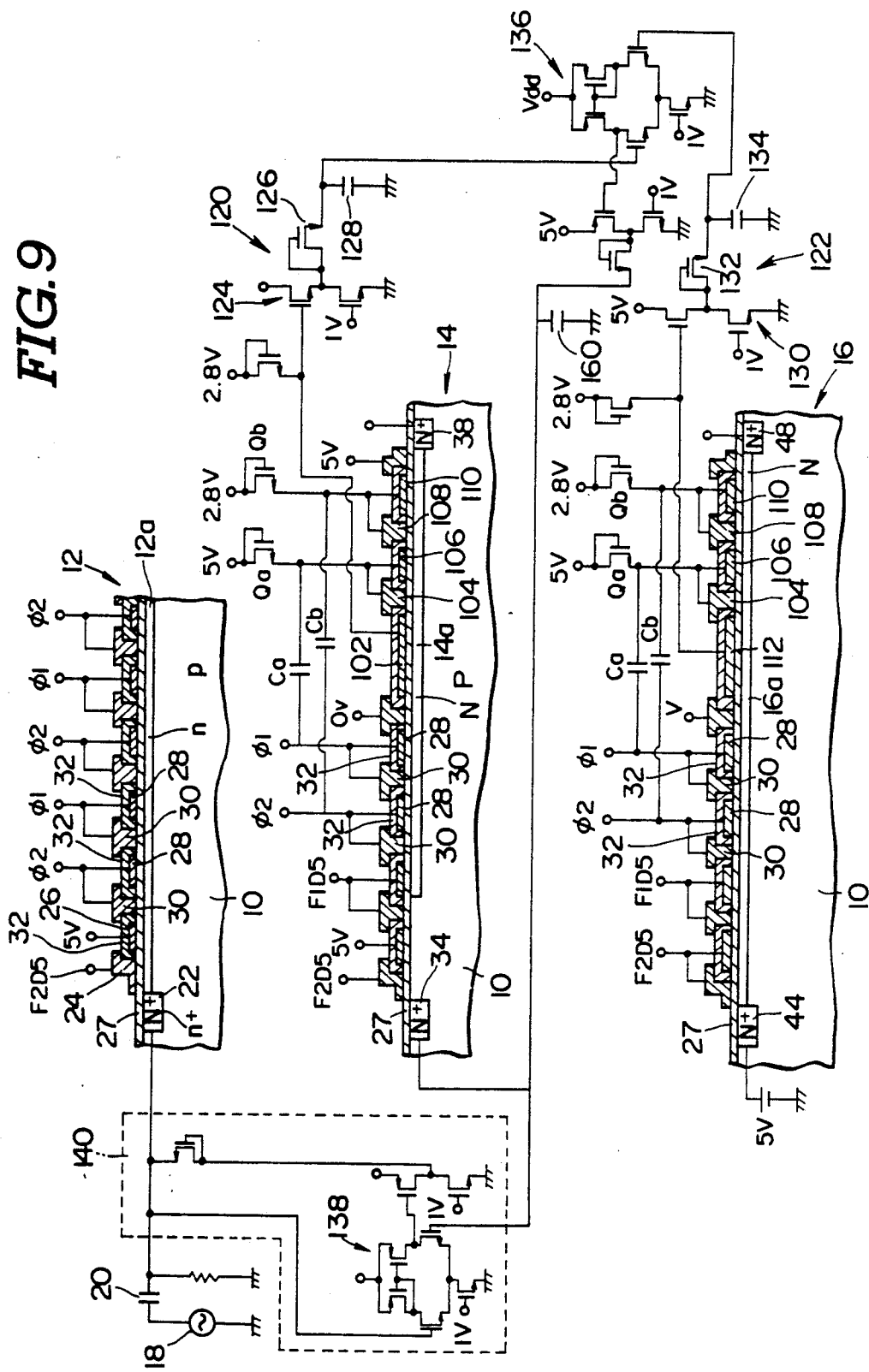
FIG. 9 is a diagrammatic illustration showing the detailed construction of the preferred embodiment of CCD according to the invention.

As will be appreciated herefrom, various modifications can be made without departing from the principle of the present invention. Therefore, the present invention should be understood as to include all of the possible embodiments and modifications exhibiting effects matching or similar to those illustrated hereabove. In particular, the invention should not be understood as being specifically for application to a of two-phase, buried-channel CCD device with two-level, n-channel gate electrodes but should be appreciated to include various types of CCD systems including surface-channel types as well as buried-channel types, and with any practical number of clock phases FIGS. 8 and 9 illustrate the second embodiment of a CCD system according to the present invention. The elements in this embodiment common to the former first embodiment will be represented by the same reference numerals and the detailed description therefor neglected in order to simplify the disclosure.

The signal register 12 has a source region 22 which comprises an N+ diffusion in the P-type silicon substrate 10. The signal register 12 also has first and second input polysilicon gate electrodes 24 and 26 deposited on the insulating layer 27 and mutually insulated by an interleaved insulating layer 32 of silicon dioxide. To the gate electrode 24, a $F_2 D_5$ is applied On the other hand, to the gate electrode 26, a 5V charge is applied The signal register 12 also has a plurality of first-level electrodes 28 and a plurality of second-level electrodes 30 all of polysilicon and mutually insulated by $SiO_2$ layers 32. To the electrodes 28, a clock pulse $\phi_2$ is applied. On the other hand, to the electrodes 30, a clock pulse $\phi_1$ is applied.

The first and second input gate electrodes 24 and 26 extend over the channel 12a of the first reference register 14 so that they also serves as input gate electrodes for the latter. The first-and second-level electrodes 28 and 30 extend over both the first and second reference registers 14 and 16 to serve in pairs as shift-staging electrodes for each.

The first reference register 14 has a source region 34 which is similar to that in the signal register 12 and comprises an N+ diffusion in P-type silicon substrate 52. The first reference register 14 also has a N+ floating gate 102 and a N+ diffusion region used as a pre-charge drain region 38. The first reference register 14 also has transfer electrodes 104, 106, 108 and 110 comprised of polysilicon deposited on the $SiO_2$ insulator 10. The transfer electrodes 104 and 108 are formed as the second-level electrodes and respectively connected to capacitors Cb and Ca. The capacitors Cb and Ca are connected to receive the transfer pulses $\phi_2$ and $\phi_1$. On the other hand, the capacitors Cb and Ca are also connected to a charge voltage source to receive 2.8V and 5V of charge voltages. With these charge voltages, the capacitors Cb and Ca are charged. By the charged level in the capacitors Cb and Ca, the levels of the clock pulses $\phi_2$ and $\phi_1$ are raised. Similarly, the transfer electrodes 106 and 110 are the first-level electrodes and connected to receive the raised level clock pulses via the capacitors Cb and Ca. Therefore, a higher level of transfer pulses are applied to the transfer electrodes 104, 106, 108 and 110 than are applied to the transfer electrodes 28 and 30. This formation provides a deeper potential well downstream of the floating gate 102.

The second reference register 16 also has a source region 44 comprising an N+ diffusion region in the P-type silicon substrate 10. The source region 44 is similar geometrically to the source regions of the signal register 12 and the first reference register 14. The second reference register 16 also has a N+ floating gate 112 which is similar to that 102 in the first reference register 14. A pre-charge drain region 48 in the second reference register 16 is also provided substantially in the same manner as that 38 of the first reference register 14. First-level and second-level transfer electrodes 28 and 30 are also formed on the second reference register 16 in common with the first reference register 14. The second reference register 16 also has the transfer electrodes 104, 106, 108 and 110 in common with the first reference register 14.

The floating gates 102 and 112 of the first and second reference registers 14 and 16 are respectively connected to the peak hold circuits 120 and 122 in order to form floating gate amplifier type transferred charge detecting systems in combinations.

This floating gate amplifier type transferred charge detecting system is advantageously employed because of the lower voltage required for obtaining charge at the floating gate, in comparison with that required in floating diffusion amplifier type transferred charge detecting systems. That is, while the floating diffusion amplifier type transferred charge detecting system requires two power sources, one of which has 9V and the other has 5V, for example, the floating gate amplifier type can be operated with a single power source, e.g. 5V. In case of the floating gate amplifier type transferred charge detecting system, it is required to form a deeper potential well downstream of the floating gate than upstream. For forming the deeper potential well, a higher voltage is required. This is clearly a drawback degrading advantageous performance in a floating gate type amplifier. In order to overcome the aforementioned drawback, the shown embodiment employs capacitors Ca and Cb. These capacitors Ca and Cb are designed to receive transfer pulses $\phi_1$ and $\phi_2$ and to raise the voltage of the transfer pulses applied to the transfer gates 104, 106, 108 and 110 making the potential well deeper as set forth above for successfully obtaining the charge transferred through the channels 14a and 16a of the first and second reference registers 14 and 16.

The peak hold circuit 120 comprises an emitter follower circuit 124, MOSFET 126 and a peak holding capacitor 128. Similarly, the peak hold circuit 122 comprise an emitter follower 130, MOSFET 132 and a peak holding capacitor 134. With the constructions set forth above, the peak hold circuits successfully detect the charge transferred through the first and second reference registers 14 and 16. These peak hold circuits 120 and 122 thus output the peak value of the transferred charge to the differential amplifier 136.

The output of the peak hold circuit 120 is connected to an inverting input 150 of a differential amplifier 136. On the other hand, the output of the peak hold circuit 122 is connected to a non-inverting input 152 of the differential amplifier 136. The differential amplifier 136 thus inputs the adjusted level of charge to a differential amplifier 138 of an input clamp circuit 140 via a low-pass filter 142 as the direct current input bias for the signal register. The output of the differential amplifier 136 is connected to a non-inverting input 154 of the differential amplifier 138 of the input clamp circuit 140 and the input of the first reference register 14.

The low-pass filter 142 which comprises a resistor 158 and a capacitor 160, is interposed between the output of the differential amplifier 136 and the input of the first reference resister 14. The low-pass filter 142 serves for forming a direct input bias for the signal register 12. The direct input bias as the output of the low-pass filter 142 is thus also applied to the non-inverting input 154 of the differential amplifier 138 of the input clamp circuit 140 as a reference voltage for adjusting the input bias for the signal register 12. The differential amplifier 138 of the input clamp circuit 140 comprises an inverting input 144 connected to the signal line 146 connecting the output of the capacitor 20 and the input of the signal register 12. The output of the differential amplifier 138 is connected to the signal line via a diode 156.

First, since the peak hold circuits are used for detecting the charge transferred through the first and reference registers, the circuit construction of the transferred charge detecting systems can be substantially simplified. Furthermore, since the peak hold circuits employed in the present invention, do not require the sample/hold timing pulse, noise generated by the sample/hold timing pulse, will be never superimposed on the outputs of the transferred charge detecting systems.

Furthermore, according to the shown embodiment, since the transfer pulse for transferring the charge through the channels of the first and second reference register can be used for obtaining a charge at the floating gates, the automatic input bias adjustment can be applied in the floating gate amplifier type CCD.

While the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims.

What is claimed is:

1. A bias setting circuit for a main charge coupled device, said main charge coupled device including a first input electrode, a plurality of gate electrodes and a first output electrode, all of said first input electrode, gate electrodes and first output electrode being formed on a single semiconductor substrate, said first input electrode being applied with an A.C. signal and a first D.C. bias voltage, each of said gate electrodes being applied with a pulse voltage, an electric charge not more than the maximum transferable electric charge being transferred from said first input electrode to said first output electrode through a channel formed under said gate electrodes, said first output electrode generating a signal voltage corresponding to the transferred electric charge, said bias voltage setting circuit comprising:

a first auxiliary floating gate amplifier-type charge coupled device including a second input electrode and a second output electrode each formed on said semiconductor substrate, said second input electrode being applied with a second D.C. bias voltage, an electric charge with a first given fraction to said maximum transferable charge of said main charge coupled device being detected by said second output electrode, said first auxiliary charge coupled device generating a first output voltage corresponding to said electric charge with said first given fraction to said maximum transferable charge of said main charge coupled device;

a first peak hold circuit connected to said first auxiliary charge coupled device and applied with said first output voltage from said first auxiliary charge coupled device, for holding peak value of said first output voltage to generate a first D.C. voltage;

a second auxiliary floating gate amplifier-type charge coupled device including a third input electrode and a third output electrode, each formed on said semiconductor substrate, said third input electrode being applied with a third D.C. bias voltage, said third output electrode generating a second output voltage in accordance with said third D.C. bias voltage;

a second peak hold circuit connected to said second auxiliary charge coupled device and applied with said second output voltage from said second auxiliary charge coupled device, for holding the peak value of said second output voltage to generate a second D.C. voltage;

a comparison circuit connected to said first and second peak hold circuit and applied with said first D.C. voltage from said first peak hold circuit and said second D.C. voltage from said second peak hold circuit, for comparing said first and second D.C. voltages to generate a detection signal when said second D.C. voltage is different from said first D.C. voltage, said detection signal being supplied to said second auxiliary charge coupled device, to vary said input bias voltage so that said second D.C. voltage becomes substantially equal to said first D.C. voltage; and bias voltage supplying means connected between said third input electrode of said second auxiliary charge coupled device and said first input electrode of said main charge coupled device for supplying said third D.C. bias of said third input electrode to said main charge coupled device to use said third D.C. bias voltage as said first D.C. bias of said first input electrode; and wherein said second and third output electrodes comprise floating gates formed on channels of said first and second auxiliary charge coupled device, said first and second auxiliary charge coupled devices having one or more gate electrodes between said second and third electrodes and said second and third output electrodes, to which transfer pulses are applied for transferring electric charges, and one or more auxiliary gate electrodes provided downstream of said second and third output electrodes, which auxiliary gate electrodes are connected to means for raising level of said transfer pulses to receive the raised level transfer pulses.

2. A charge coupled device comprising:

a signal register for transferring input electric charges therethrough, said signal register having an input section;

a first reference register having essentially the same structure and capacity for handling a charge to transfer as said input section of signal register, said first reference register having a first output section;

a second reference register having essentially the same structure as said first reference register and providing a capacity for handling a charge to transfer rated at a given rate versus the handling charge of said first reference register, said second reference register having a second output section, wherein said output sections of said first and second reference registers comprise a floating gate for outputting outputs corresponding to the charges respectively transferred through transfer channels of said first and second reference register;

a first peak hold circuit connected to said first output section of said first reference register for holding a peak value of the charge transferred through said first reference register; and a second peak hold circuit connected to said second output section of said second reference register for holding a peak value of the charge transferred through said second reference register;

means for deriving DC input bias for said input section of said signal register based on said peak values held by said first and second peak hold circuit; and means for forming potential wells in said transfer channels of said first and second registers and downstream of said floating gate, said potential wells being deeper than that upstream of said floating gate.

3. A charge coupled device as set forth in claim 2, wherein said means for forming potential well downstream of said floating gate comprise means for rising level of transfer pulses which are applied to transfer electrodes of said first and second reference registers and applying to the section of the corresponding first and second reference registers downstream of said floating gate.

4. A charge coupled device comprising:

a signal register for transferring input electric charges therethrough, said signal register having an input section;

a first reference register having essentially the same structure and capacity for handling of charge to transfer as to said input section of signal register, said first reference register having a first output section;

a second reference register having essentially the same structure as said first reference register and provided a capacity of handling of charge to transfer rate at a give rate versus the handling charge of said first reference register, said second reference register having a second output section, wherein said output sections of said first and second reference registers comprise a floating gate for outputting outputs corresponding to the charges respectively transferred through transfer channels of said first and second reference register;

a first peak hold circuit connected to said first output section of said first reference register for holding peak value of the charge transferred through said first reference register;

a second peak hold circuit connected to said second output section of said second reference register for holding peak value of the charge transferred through said second reference register;

means for deriving DC input bias for said input section of said signal register based on said peak values held by said first and second peak hold circuit;

which further comprises means for forming potential wells in said transfer channels of said first and second register and downstream of said floating gate, said potential wells being deeper than that upstream of said floating gate; and wherein said means for forming potential wells downstream of said floating gate comprises means for raising a level of transfer pulses which are applied to transfer electrodes of said first and second reference registers and applying to the section of the corresponding first and second reference registers downstream of said floating gate.

* * * * *